United States Patent
Ko

(10) Patent No.: US 9,356,234 B2
(45) Date of Patent: May 31, 2016

(54) ELECTRONIC DEVICE AND METHOD FOR FABRICATING THE SAME

(71) Applicant: SK HYNIX INC., Icheon (KR)

(72) Inventor: Young-Seok Ko, Icheon (KR)

(73) Assignee: SK HYNIX INC., Icheon (KR)

( * ) Notice: Subject to any disclaimer, the term of this patent is extended or adjusted under 35 U.S.C. 154(b) by 122 days.

(21) Appl. No.: 14/453,505

(22) Filed: Aug. 6, 2014

(65) Prior Publication Data

US 2015/0187415 A1 Jul. 2, 2015

(30) Foreign Application Priority Data

Jan. 2, 2014 (KR) .................. 10-2014-0000284

(51) Int. Cl.
*H01L 45/00* (2006.01)
*G11C 13/00* (2006.01)
*H01L 27/24* (2006.01)

(52) U.S. Cl.
CPC .......... *H01L 45/1253* (2013.01); *H01L 27/249* (2013.01); *H01L 27/2409* (2013.01); *G11C 13/003* (2013.01); *G11C 2213/71* (2013.01); *G11C 2213/78* (2013.01); *H01L 45/04* (2013.01); *H01L 45/06* (2013.01); *H01L 45/1226* (2013.01); *H01L 45/146* (2013.01); *H01L 45/1691* (2013.01)

(58) Field of Classification Search
CPC ............ H01L 45/1226; H01L 45/1253; H01L 27/2409; H01L 27/249; G11C 13/003; G11C 2213/70; G11C 2213/71; G11C 2213/78
See application file for complete search history.

(56) References Cited

U.S. PATENT DOCUMENTS

| | | | | |
|---|---|---|---|---|
| 8,120,068 | B2 * | 2/2012 | Scheuerlein | G11C 13/0004 257/211 |
| 8,384,061 | B2 * | 2/2013 | Mikawa | H01L 27/101 257/2 |
| 8,570,786 | B2 * | 10/2013 | Murooka | H01L 45/04 365/148 |
| 8,735,860 | B2 * | 5/2014 | Park | H01L 45/1206 257/2 |
| 8,811,061 | B2 * | 8/2014 | Tsuji | H01L 27/101 257/4 |
| 9,093,370 | B2 * | 7/2015 | Hwang | H01L 27/249 |
| 2008/0265235 | A1 * | 10/2008 | Kamigaichi | H01L 27/2409 257/2 |
| 2013/0210211 | A1 * | 8/2013 | Vereen | H01L 45/1233 438/382 |

FOREIGN PATENT DOCUMENTS

| | | |
|---|---|---|
| KR | 10-2013-0107876 A | 10/2013 |
| KR | 10-2015-0053067 A | 5/2015 |

* cited by examiner

*Primary Examiner* — Allison P Bernstein

(57) ABSTRACT

An electronic device including a semiconductor memory unit that includes a cell structure having two memory cells, which share one selector, wherein the cell structure includes first electrodes, variable resistance patterns and second electrodes which are symmetrically disposed on both sides of the selector.

17 Claims, 16 Drawing Sheets

ABSTRACT# ELECTRONIC DEVICE AND METHOD FOR FABRICATING THE SAME

CROSS-REFERENCE TO RELATED APPLICATIONS

The present application claims priority of Korean Patent Application No. 10-2014-0000284, filed on Jan. 2, 2014, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on, have been demanded in the art, and research has been conducted for the semiconductor devices. Such semiconductor devices include semiconductor devices which may store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

Embodiments of this disclosure relate to memory circuits or devices and their applications in electronic devices or systems and various implementations of an electronic device for increasing the integration, and reducing the complexity and/or quantity of fabrication processes and fabrication costs.

In one aspect, an electronic device is provided to include a semiconductor memory unit that includes a cell structure having two memory cells, which share one selector, wherein the cell structure includes a first electrode, a variable resistance pattern and a second electrode, which are symmetrically disposed on both sides of the selector.

Implementations of the above electronic device may include one or more the following.

The selector, the first electrode and the variable resistance pattern may include a line type, which is extended in a first direction. The second electrode may include a pillar type and may be disposed at a constant interval in a first direction. The cell structure may be disposed at a constant interval in a second direction crossing a first direction. The semiconductor memory unit may further comprise an isolation insulation layer disposed between the cell structures.

In one aspect, an electronic device is provided to include a semiconductor memory unit that includes a multi-stack structure that cell structures are vertically stacked, wherein the cell structures include two memory cells sharing a selector, and wherein a first electrode, a variable resistance pattern and a second electrode are symmetrically disposed on both sides of the selector.

Implementations of the above method may include one or more of the following.

The selector, the first electrode and the variable resistance pattern may include a line type extended in a first direction. The second electrode may include a pillar type, which vertically penetrates the multi-stack structure, and may be disposed at a constant interval in a first direction. The semiconductor memory unit may further comprise an interlayer insulation layer disposed between the cell structures which are vertically stacked. The cell structures may be repeatedly disposed at a constant interval in a second direction crossing a first direction. The semiconductor memory unit may further comprise an isolation insulation layer disposed between the cell structures of the second direction. The electronic device may further comprise a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor. The electronic device may further comprise a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that is part of the cache memory unit in the processor. The electronic device may further comprise a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor perform the operation using the program and the information when executing the program; and an interface device configured to perform communication between at least one of the processor, the auxiliary memory device and the main memory device and the outside, wherein the semiconductor memory unit is part of the auxiliary memory device or the main memory device in the processing system. The electronic device may further comprise a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is part of the storage device or the temporary storage device in the data storage system. The electronic device may further comprise a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory unit that is part of the memory or the buffer memory in the memory system.

In one aspect, a method for fabricating an electronic device is provided to include forming a structure and an isolation insulation layer, which isolates the structure, wherein the structure includes a selector of a line type extended in a first direction on a substrate, a first electrode disposed symmetrically on both side walls of the selector, and a variable resistance pattern; forming an interlayer insulation layer in the structure and the isolation insulation layer; forming a multi-stack structure by alternately and vertically stacking the structure, the isolation insulation layer and the interlayer insulation layer on the substrate; forming an opening unit exposing the substrate by etching the isolation insulation layer and the interlayer insulation layer to penetrate the multi-stack structure; and forming a second electrode burying the opening unit.

Implementations of the above method may include one or more of the following.

The forming of the structure may comprise forming the selector of the line type expanded in a first direction on the substrate; forming a conducting layer along the substrate including the selector; forming the first electrode by etching the conducting layer remained in both side walls of the selector; forming the variable resistance layer along the substrate including the selector and the first electrode; and forming the variable resistance pattern on a side wall of the first electrode by etching the variable resistance layer. The variable resistance pattern includes a metal oxide layer.

DETAILED DESCRIPTION

Figure 1:
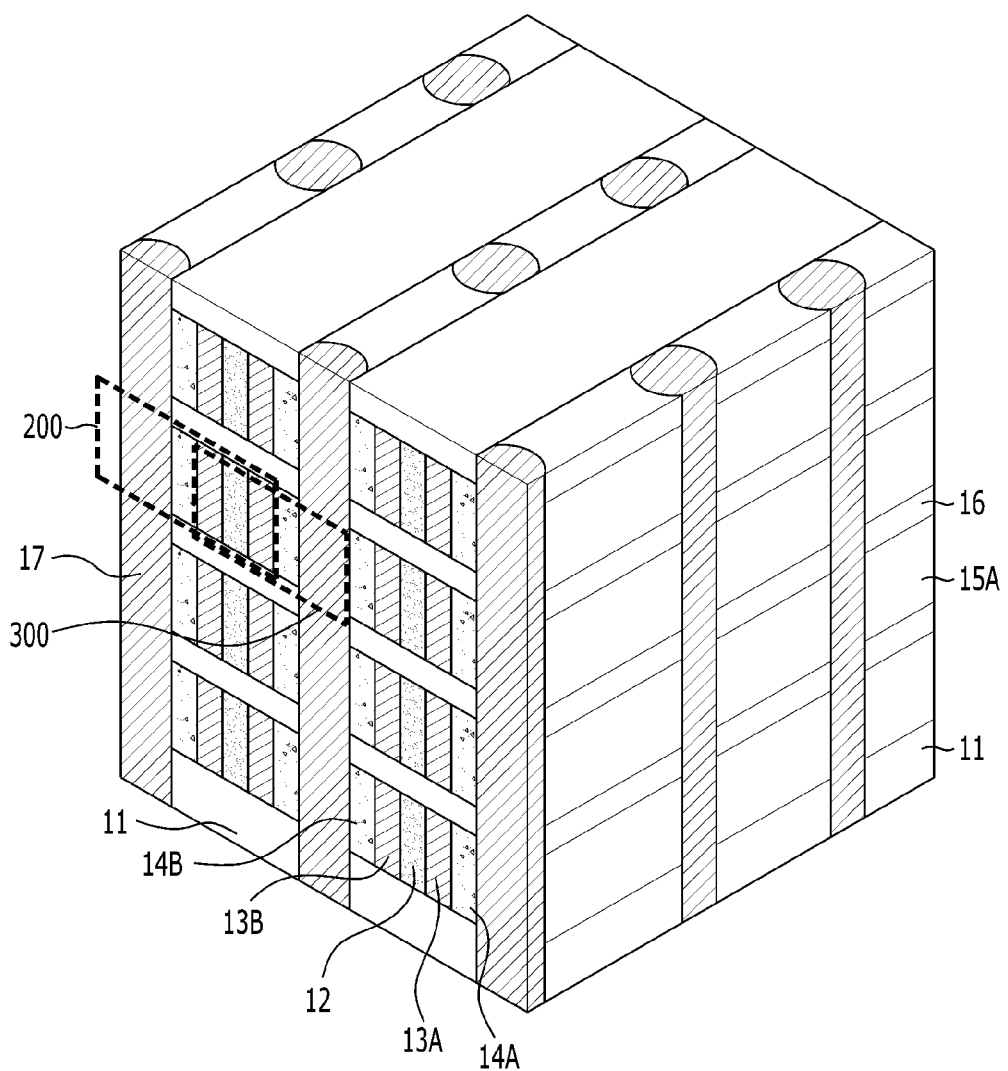
FIG. 1 is a perspective view illustrating a semiconductor device in accordance with an embodiment of the present invention.

Various embodiments are described below in detail with reference to the accompanying drawings.

The drawings may not be necessarily to scale and in some instances, proportions of at least some of structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a perspective view illustrating a semiconductor device in accordance with an embodiment of the present invention.

Referring to FIG. 1, a semiconductor device according to an embodiment includes an insulation layer 11 which is formed on a substrate (not shown), and a multi-layered stack structure in which a plurality of memory cells are vertically stacked on the insulation layer 11. The multi-stack structure includes cell structures in which two adjacent memory cells 200 and 300 share the same selector 12. In an embodiment, each memory cell 200 and 300 includes first electrodes 13A and 13B disposed on opposing sides of a single selector 12, variable resistance patterns 14A and 14B, and a second electrode 17. Accordingly, each memory cell 200 and 300 may share a single selector as well as two first electrodes 13A and 13B.

In an embodiment, a memory cell 200 may include the second electrode 17, the variable resistance pattern 14B, the first electrode 13B, the selector 12 and the first electrode 13A. Similarly, memory cell 300 may include the first electrode 13B, the selector 12, the first electrode 13A, the variable resistance pattern 14A and the second electrode 17. A cell structure comprising memory cells 200 and 300 includes a single selector 12, first electrodes 13A and 13B, variable resistance patterns 14A and 14B, and two second electrodes 17 disposed on opposing sides of the variable resistance patterns 14A and 14B.

In each memory cell, the first electrodes 13A and 13B between variable resistance patterns 14A and 14B and the selector 12 are lower electrodes of the variable resistance patterns 14A and 14B. The first electrodes 13A and 13B may also be intermediate electrodes which electrically couple the selector 12 to the variable resistance patterns 14A and 14B, and may perform a barrier function between the selector 12 and the variable resistance patterns. For example, in order to operate memory cell 200, a voltage is applied between first electrode 13A on the right side of a selector 12 and the second electrode 17 adjacent to variable resistance pattern 14B on the left side. In an embodiment in which the selector 12 has a threshold voltage $V_{th}$ and a voltage in excess of $V_{th}$ applied between the first electrode 13A and the second electrode 17, current flows through an electrical path defined by the first electrode 13A, the selector 12, first electrode 13B, variable resistance pattern 14B, and second electrode 17. Accordingly, the second electrode 17 may be referred to as an upper electrode or a bit line of memory cell 200, and first electrode 13B may be referred to as an intermediary electrode providing an electrical path between the selector 12 and the variable resistance pattern 14B. Similarly, in order to operate the memory cell of the numeral number 300, a voltage may be applied between the first electrode 13B of a left side of the selector 12 and the second electrode 17 of a right side of the variable resistance pattern 14A, and first electrode 13A performs as an intermediary electrode.

The selector 12, the first electrodes 13A and 13B and the variable resistance patterns 14A and 14B may be line type patterns which extend in a first direction. A plurality of selectors 12, first electrodes 13 and variable resistance patterns 14 may be arranged in a single horizontal memory cell layer which is separated from other horizontal memory cell layers above and/or below by an interlayer insulation layer 16. In an embodiment with a plurality of vertically stacked memory cell layers, each memory cell layer may be separated from other memory cell layers by an interlayer insulation layer 16.

The second electrode 17 may be a pillar type electrode which penetrates a multi-layer stack structure. With respect to the orientation of the figures and primary faces of the semiconductor substrate, the second electrode may be disposed in a vertical direction, while first electrodes 13A and 13B are disposed in a horizontal direction. A plurality of second electrodes 17 may be regularly arrayed in one or more direction in a memory structure.

For example, as seen in FIG. 1, a plurality of second electrodes 17 may be regularly arrayed in the first direction parallel to the line patterns of selector 12, first electrodes 13A and 13B and variable resistance patterns 14A and 14B. In addition, a plurality of second electrodes 17 may be regularly arrayed in a second direction crossing the first direction. As shown in FIG. 1, the second direction may be orthogonal to the first direction. In an embodiment, a plurality of second electrodes 17 are arranged in a regular two-dimensional horizontal matrix. The first electrodes 13A and 13B and the second electrode 17 provide a voltage or a current to each memory cell, and may be formed of a conductive material such as a metal, a metal nitride, an impurity-doped polysilicon or a combination thereof.

The variable resistance patterns 14A and 14B may be formed of a material which switches between different resistance states according to an applied voltage or current. For example, the variable resistance patterns 14A and 14B may include various materials used in RRAM, PRAM, FRAM, MRAM, and so on. For example, variable resistance patterns 14A and 14B may comprise a ferromagnetic material, a ferroelectric material, a phase change material such as a chalcogenide material, a metal oxide layer such as a perovskite material, or a transition metal oxide layer. The variable resistance patterns 14A and 14B may be arranged in a single layer structure or a multi-layer structure.

In an embodiment, each layer of a multi-layer structure may include a plurality of cell structures which are repeatedly arrayed in a second direction. Each of the cell structures may be isolated from neighboring cell structures in the same layer by an insulation pattern 15A. More specifically, each set of a single selector 12, first electrodes 13A and 13B on opposing sides of the selector 12 and variable resistance patterns 14A and 14B may be separated from neighboring sets of selectors 12, first electrodes 13A and 13B, and variable resistance patterns 14A and 14B in the same layer by insulation patterns 15A. Insulation pattern 15A may be disposed between second electrodes 17 that neighbor one another in the first direction.

As described in this disclosure, embodiments may reduce the number and/or difficulty of fabrication processes by forming a memory cell using line type structures. As a result, processing margins may be improved relative to fabrication processes for pillar type memory cells.

FIGS. 2A to 2J are cross-sectional views illustrating a process for fabricating a semiconductor device in accordance with an embodiment of the present invention. FIGS. 3A to 3J are perspective views illustrating a process for fabricating a semiconductor device in accordance with an embodiment of the present invention. For convenience, the same numbers used in FIGS. 2A to 2J refer to the same elements in FIGS. 3A to 3J.

Figure 2A:
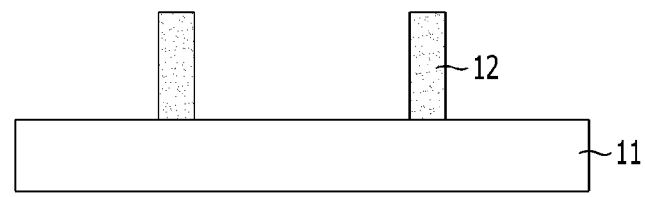
FIGS. 2A to 2J are cross-sectional views explaining a fabrication process of a semiconductor device in accordance with an embodiment of the present invention.
Figure 3A:
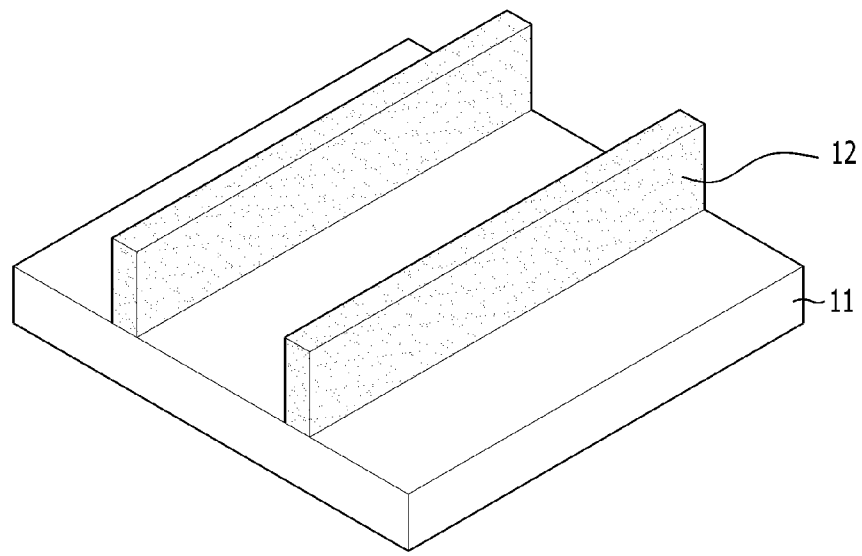
FIGS. 3A to 3J are perspective views explaining a fabrication process of a semiconductor device in accordance with an embodiment of the present invention.

Referring to FIGS. 2A and 3A, an insulation layer 11 is formed on a substrate (not shown) including a lower structure. The insulation layer 11 may include an oxide material or a nitride material. The oxide layer may include at least one of tetra-ethyl-ortho-silicate (TEOS), boron-phosphorus-silicate-glass (BPSG), boron-silicate-glass (BSG), phosphorus-silicate-glass (PSG) and fluorinated-silicate-glass (FSG).

Subsequently, a selector 12 is formed on the insulation layer 11. The selector 12 may be formed as a line type pattern extending in a first direction parallel with the substrate. The selector 12 may be formed with a threshold switching material or a varistor material. The selector 12 may include an oxide material layer.

Figure 2B:
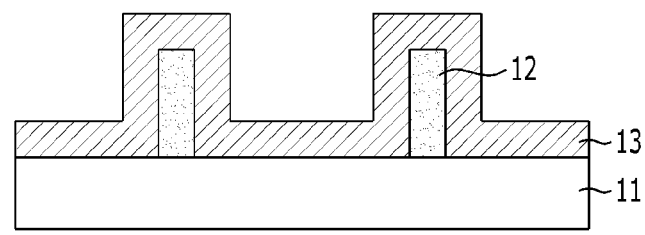
Figure 3B:
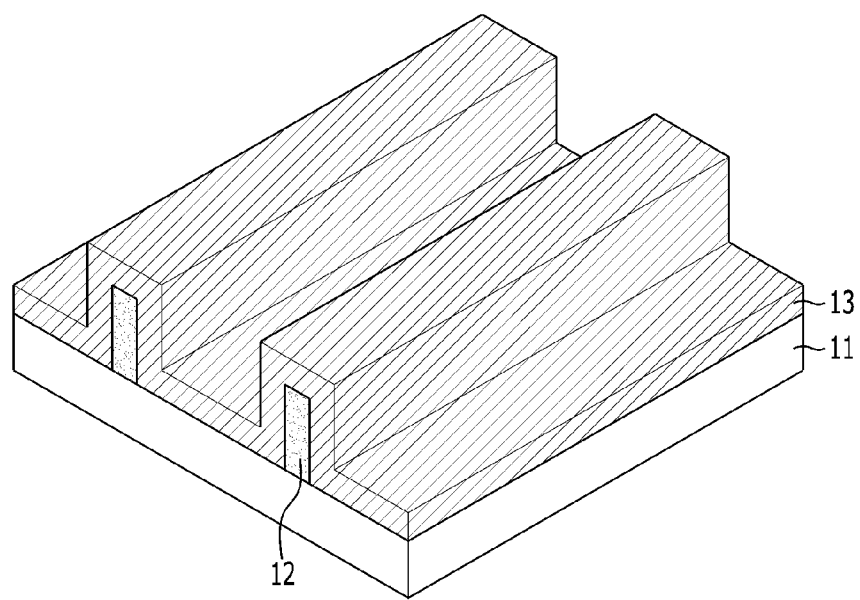

Referring to FIGS. 2B and 3B, a conductive layer 13 is formed over exposed surfaces of the insulation layer 11 and the selector 12. The conductive layer 13 may be formed of a conductive material such as a metal, a metal nitride, an impurity-doped polysilicon, or a combination thereof.

Figure 2C:
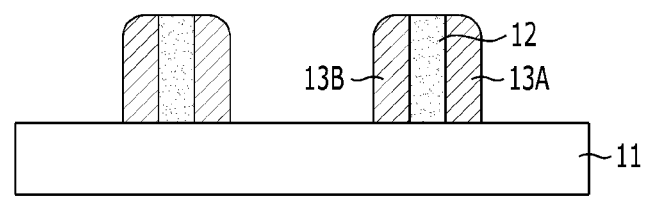
Figure 3C:
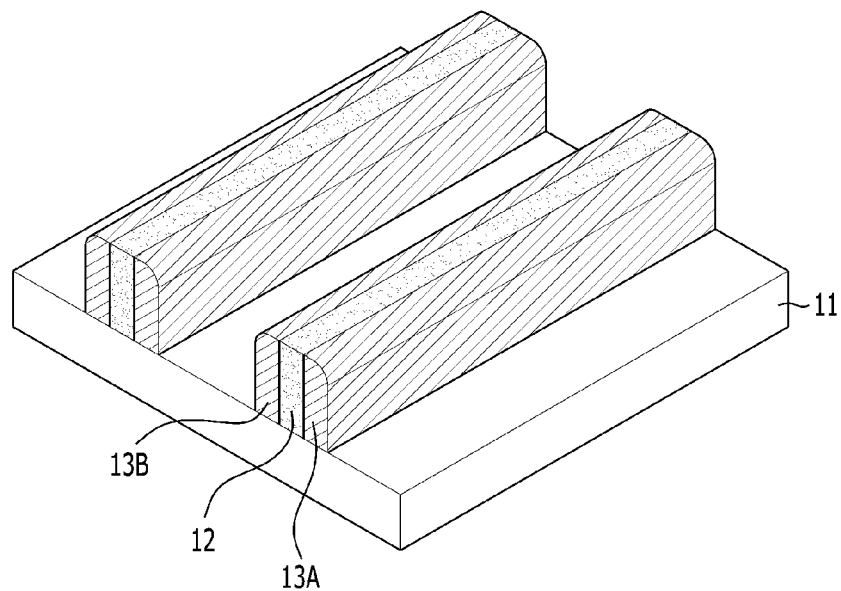

Referring to FIGS. 2C and 3C, an etching process is performed to remove portions of the conductive layer 13, while leaving portions of the conductive layer 13 on both sidewalls of the selector pattern 12. The resulting conductive patterns 13A and 13B may operate as electrodes of two memory cells. Hereinafter, elements 13A and 13B are referred to as first electrodes 13A and 13B.

Figure 2D:
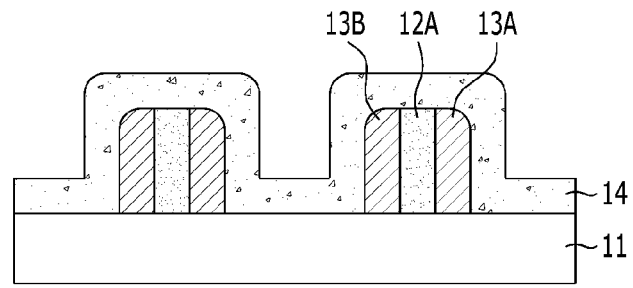
Figure 3D:
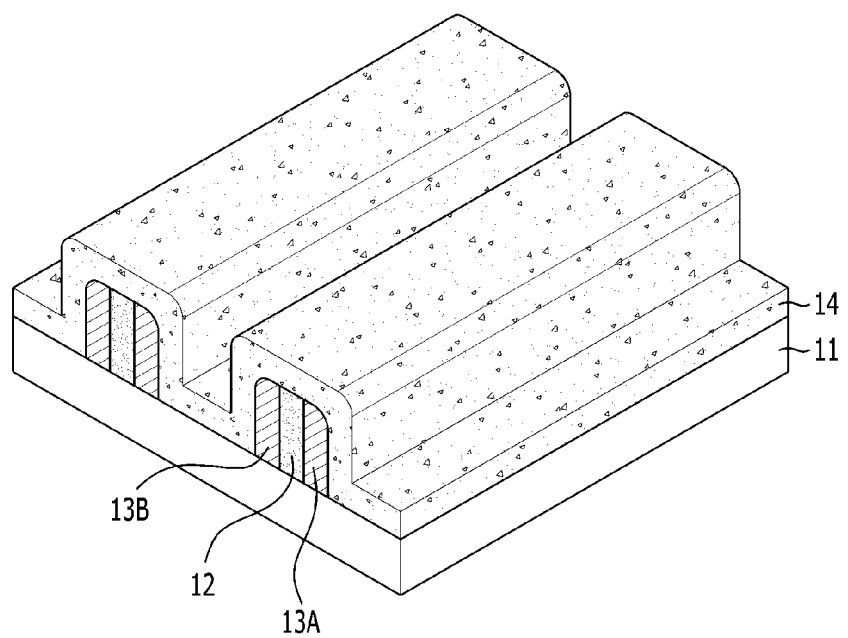

Referring to FIGS. 2D and 3D, a variable resistance layer 14 is formed over exposed surfaces of the insulation layer 11, the first electrodes 13A and 13B, and the selector 12. The variable resistance layer 14 may be formed of a material which is switched between different resistance states according to an applied voltage or current. Accordingly, the variable resistance layer 14 may include various materials used in an RRAM, a PRAM, an FRAM, an MRAM, and so on. For example, variable resistance layer a ferromagnetic material, a ferroelectric material, a phase change material such as a chalcogenide material, a metal oxide layer such as a perovskite material, or a transition metal oxide layer.

Figure 2E:
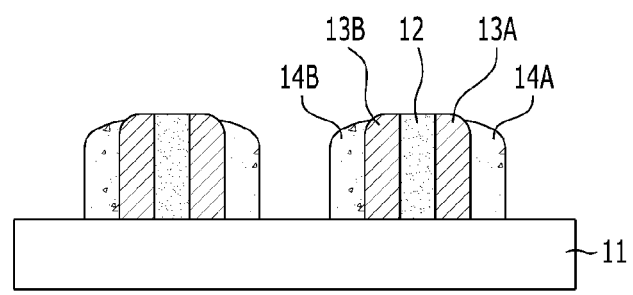
Figure 3E:
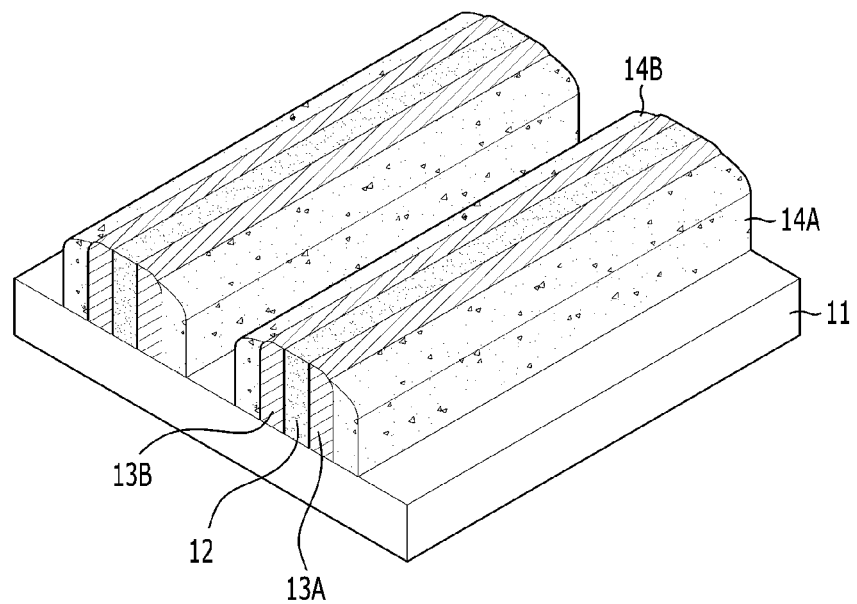

Referring to FIGS. 2E and 3E, the variable resistance layer 14 is etched so that portions of the variable resistance layer 14 remain on sidewalls of the first electrodes 13A and 13B. Hereinafter, elements 14A and 14B are referred to as variable resistance patterns 14A and 14B.

Figure 2F:
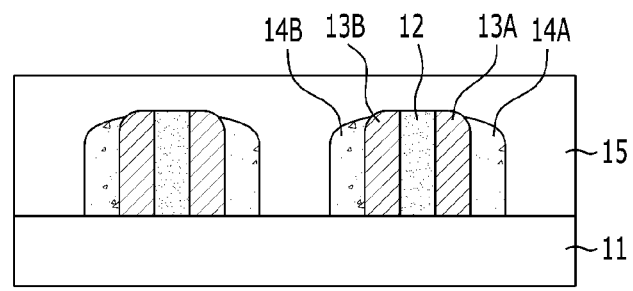
Figure 3F:
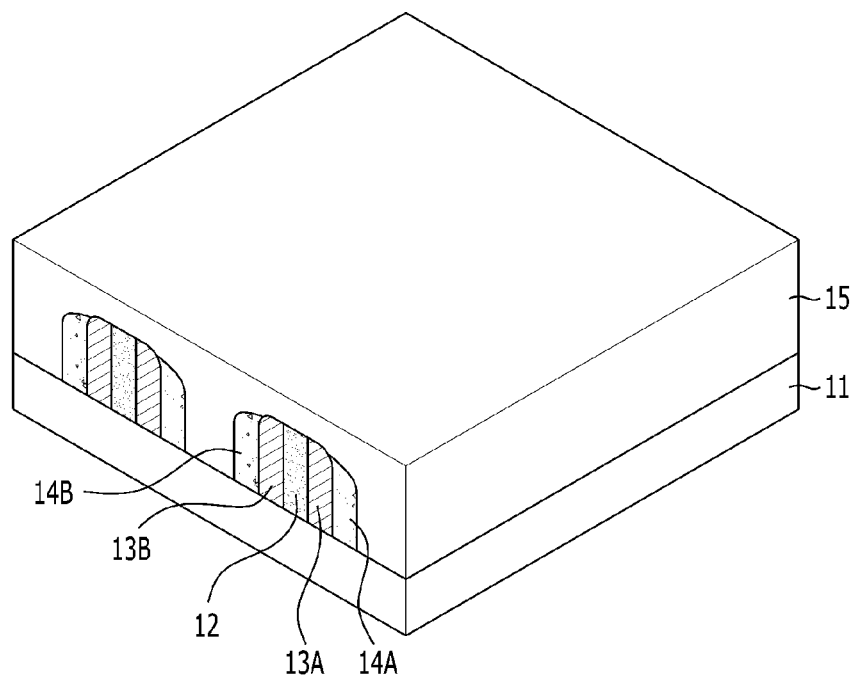

Referring to FIGS. 2F and 3F, an isolation insulation layer 15 fills spaces between patterns including the selector 12, the first electrodes 13A and 13B and the variable resistance patterns 14A and 14B. The insulation layer 15 isolates such a block of patterns from neighboring blocks of patterns. The isolation insulation layer 15 may include an oxide material or a nitride material. For example, the oxide material may include at least one of silicon oxide, TEOS, BPSG, BSG, PSG and FSG.

Figure 2G:
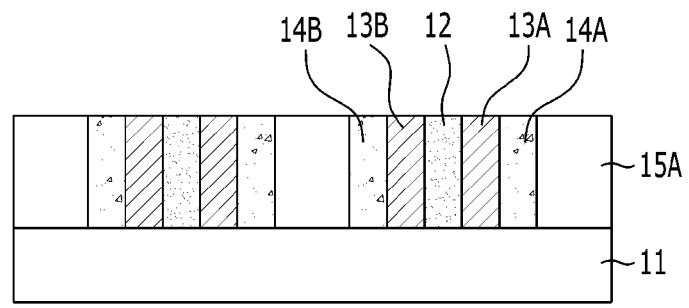
Figure 3G:
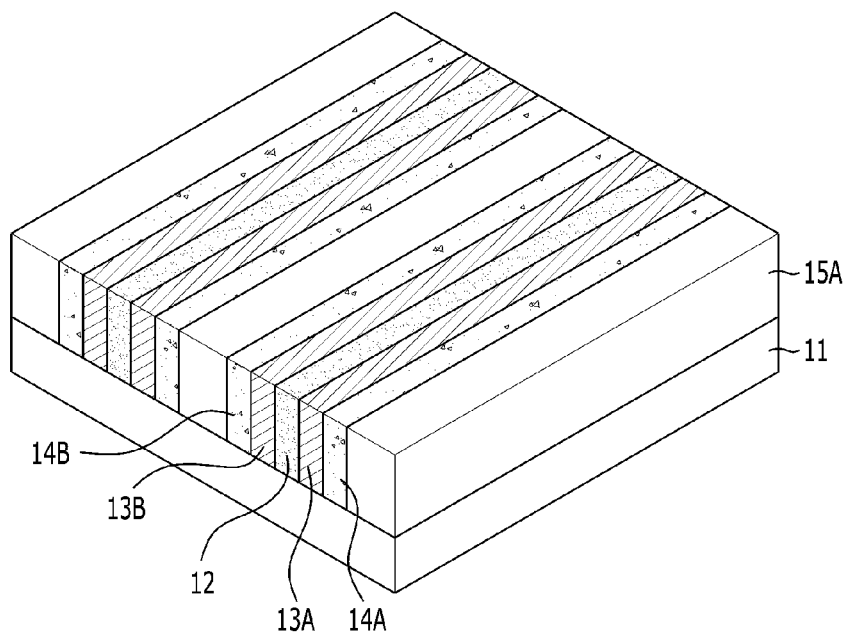

Referring to FIGS. 2G and 3G, an upper plane of the selector 12, the first electrodes 13A and 13B and the variable resistance patterns 14A and 14B is exposed by etching the isolation insulation layer 15 for form insulation patterns 15A. The processes of forming the first electrodes 13A and 13B and the variable resistance patterns 14A and 14B may result in height differences between top surfaces of these patterns. Thus, a planarization process may be performed to etch the isolation insulation layer 15 until top surfaces of the selector 12, first electrodes 13A and 13B, variable resistance patterns 14A and 14B, and insulation patterns 15A are level with one another. The planarization process may be a chemical mechanical polishing process.

Figure 2H:
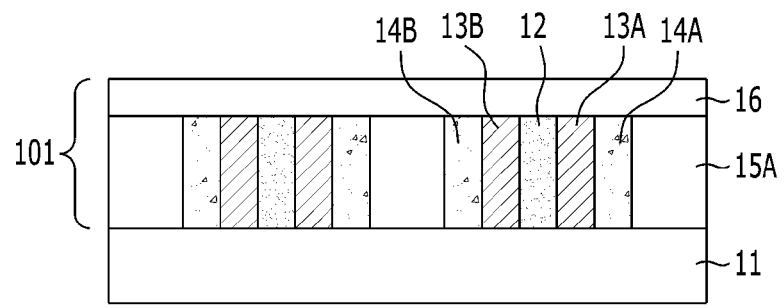
Figure 3H:
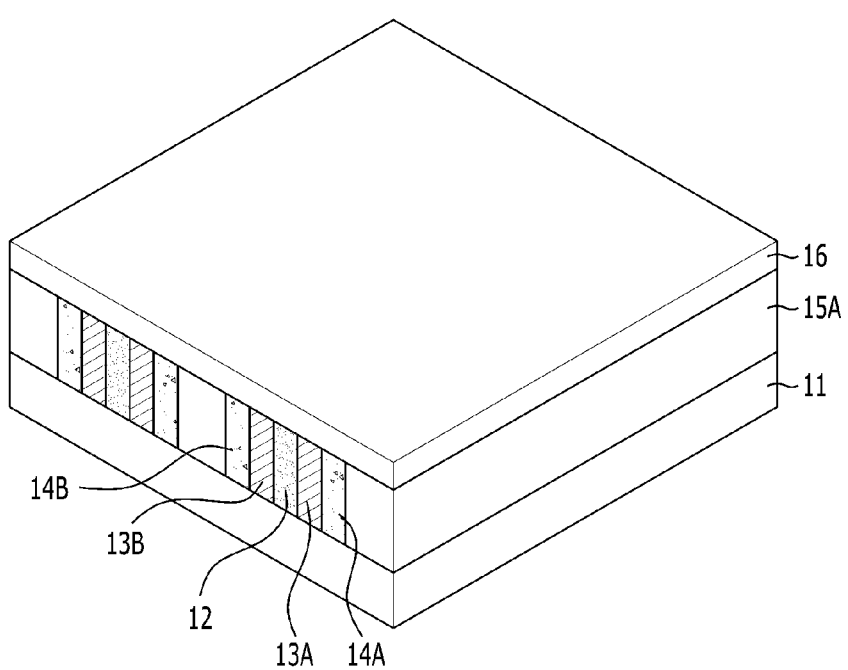

Referring to FIGS. 2H and 3H, an interlayer insulation layer 16 is formed on the leveled patterns. The interlayer insulation layer 16 insulates a first layer of patterns from a second layer of patterns formed over the first layer. In an embodiment, the interlayer insulation layer 16 may include the same material as the isolation insulation pattern 15A. The resulting structure which includes one layer of patterns and one insulation layer may be referred to as a memory layer 101.

Figure 2I:
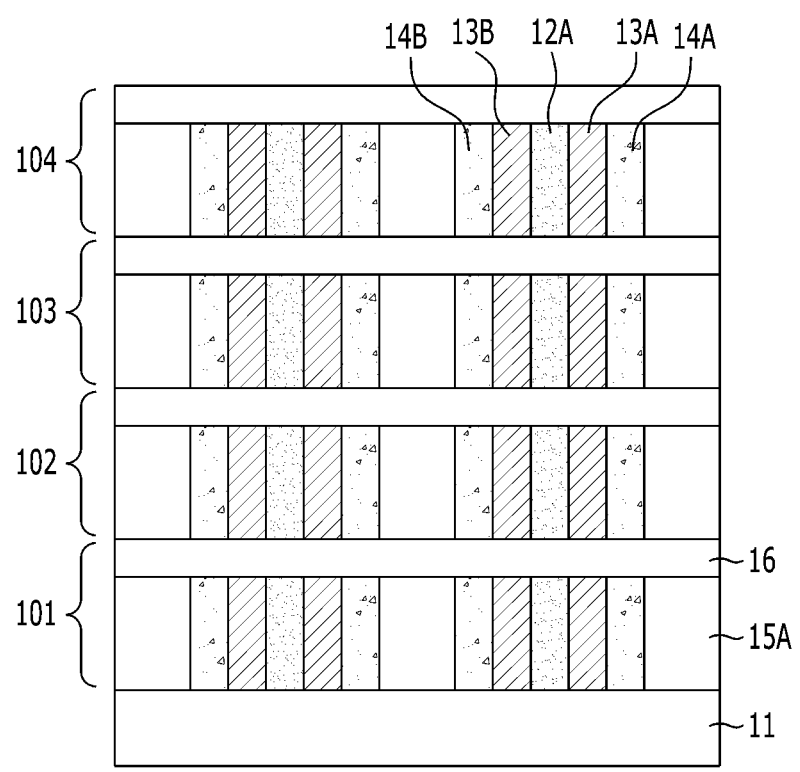
Figure 3I:
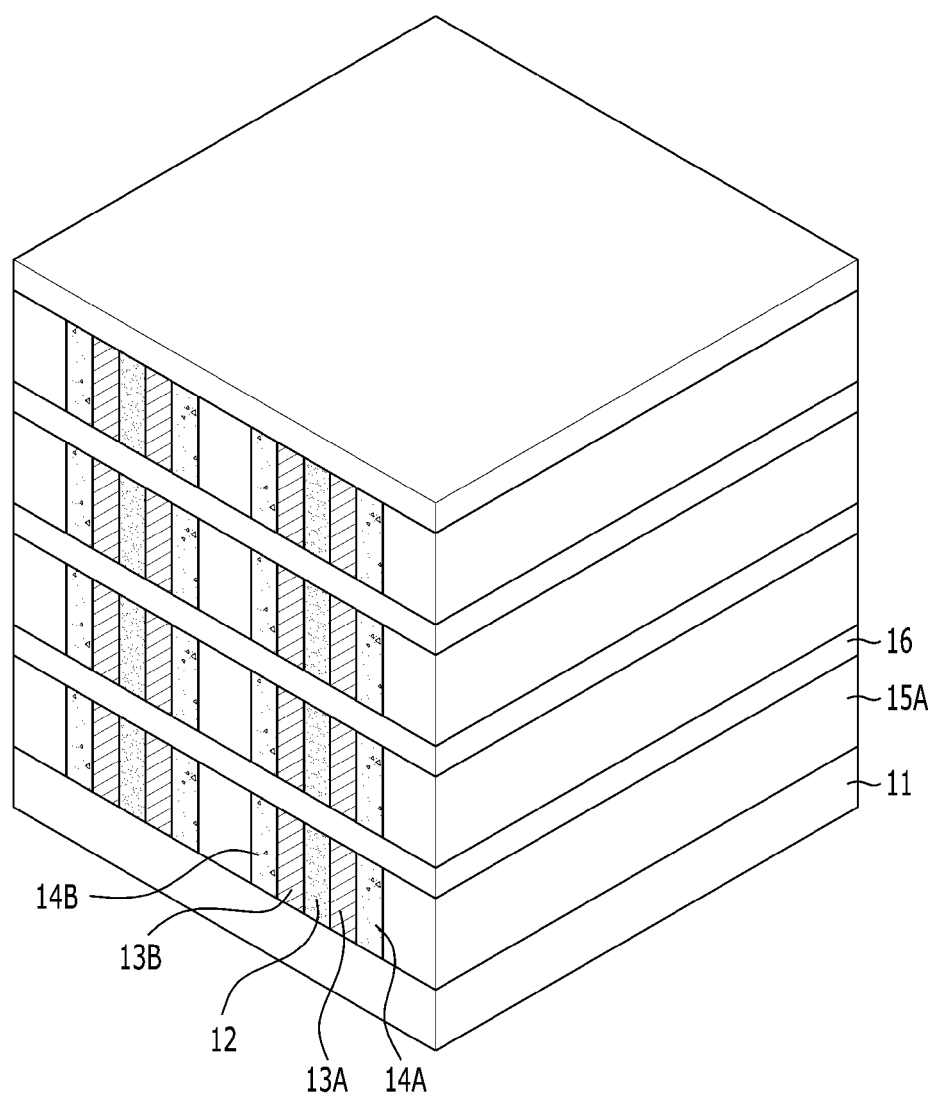

As shown in FIGS. 2I and 3I, a multi-layered stack structure may be formed by repeatedly performing the same process illustrated in FIGS. 2A to 2H. As seen in FIGS. 2I and 3I, a resulting multi-layered stack structure may include a plurality of memory layers 101, 102, 103, 104.

Figure 2J:
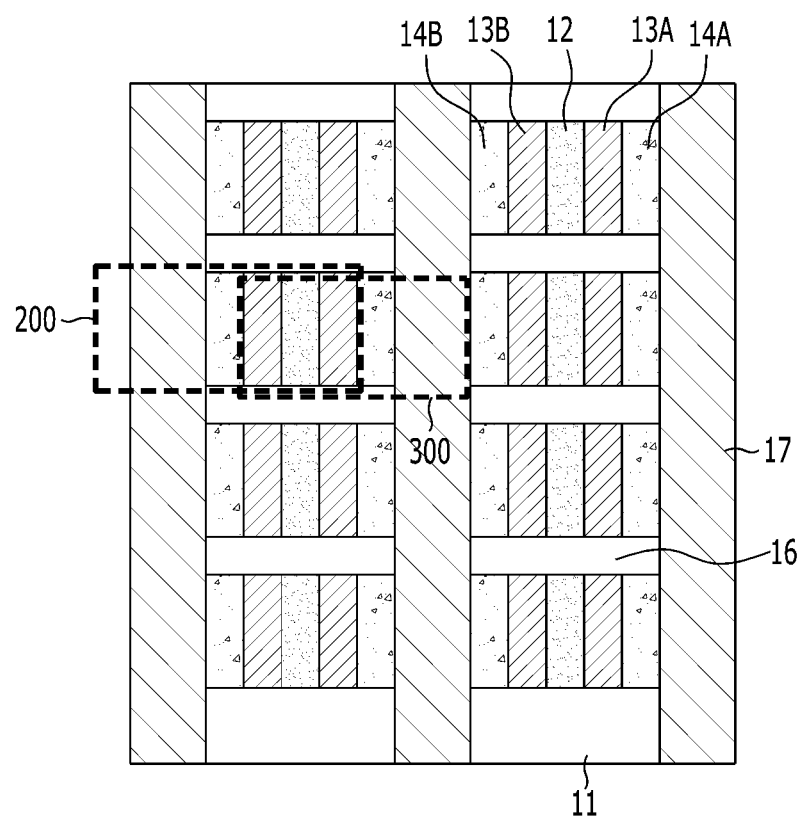
Figure 3J:
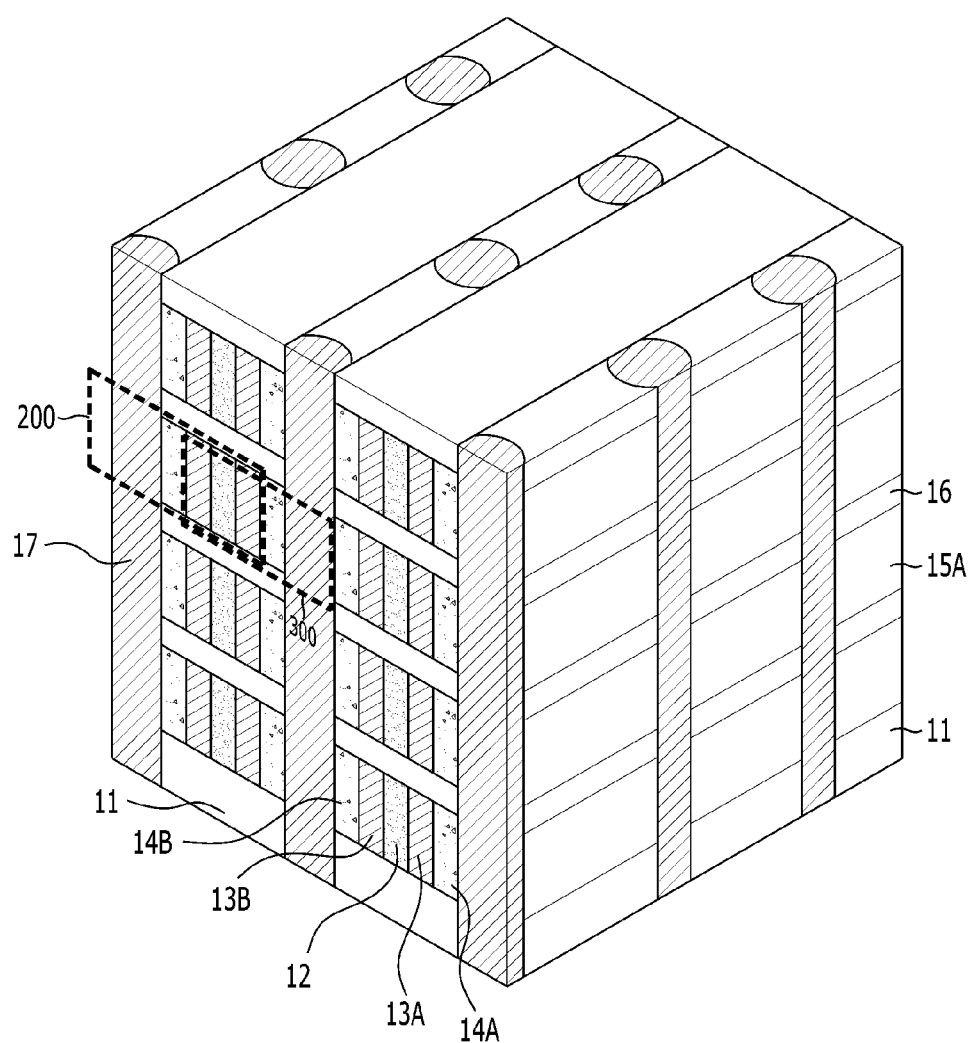

As shown in FIGS. 2J and 3J, a plurality of second electrodes 17 may be formed to penetrate the multi-layered stack structure. In an embodiment, an opening unit is formed by etching the isolation insulation and the interlayer insulation layer between each structure. A conductive material is then formed in the opening unit, thereby forming a second electrode 17. The second electrode 17 may be a pillar type electrode that is disposed in a vertical direction with respect to the substrate. A plurality of second electrodes 17 may be spaced apart by constant spaces in a first direction and a second direction.

A resulting multi-layer stacked structure includes a plurality of cell structures, each of which includes two memory cells sharing one selector 12. More specifically, each cell structure may include a memory cell 200 and a memory cell 300 which share two first electrodes 13A and 13B and a single selector 12. Memory cell 200 may include a selector 12, first electrodes 13A and 13B, a variable resistance pattern 14B, and a second electrode 17. Memory cell 300 may include the same selector 12, first electrodes 13A and 13B, a variable resistance pattern 14A, and a second electrode 17. Each of the elements of a cell structure including two adjacent memory cells may be symmetrically arranged about a central selector 12.

Moreover, a multi-layer stacked structure according to an embodiment may include the a plurality of cell structures which are repeatedly disposed in a second direction, and each of the cell structures may be isolated from neighboring cell structures in the same layer by an insulation pattern 15A.

Embodiments of this disclosure may simplify a fabrication process by implementing line type patterns, and may improve fabrication margins by simplifying the fabrication process.

The above and other memory circuits or semiconductor devices based on the disclosed technology may be used in a range of devices or systems. FIGS. 4 to 8 provide some examples of devices or systems that may implement the memory circuits disclosed herein.

Figure 4:
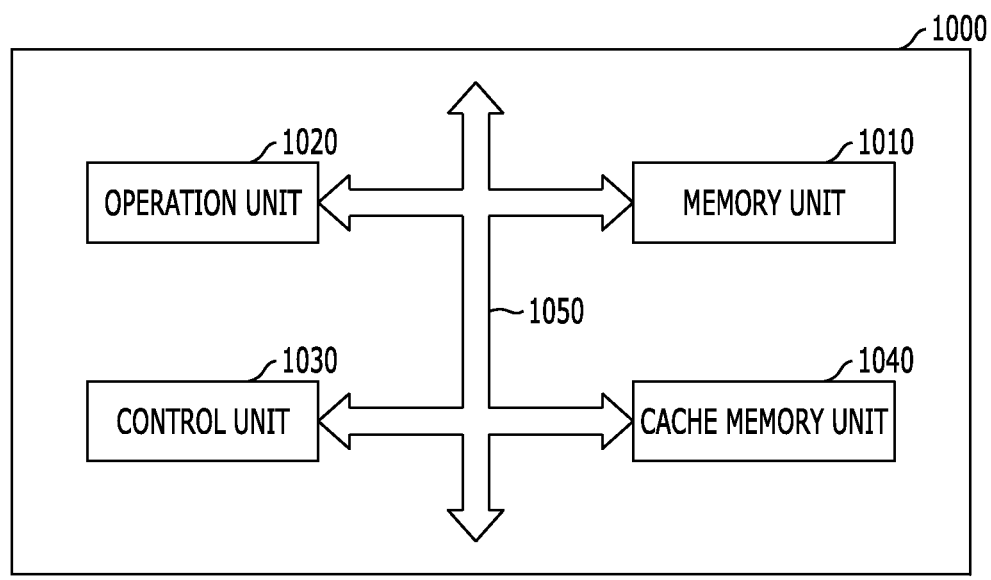
FIG. 4 is an example of configuration diagram of a microprocessor implementing memory circuitry in accordance with an embodiment of the present invention.

FIG. 4 is an example of configuration diagram of a microprocessor implementing memory circuitry in accordance with an embodiment of the present invention.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a multi-stack structure that a structure having two memory cells sharing one selector is repeatedly disposed. The structure includes a first electrode, a variable resistance pattern and a second electrode, which are symmetrically disposed on both sides of the selector. Through this, the integration of the memory unit 1010 may be increased, a fabrication process may be reduced, and a size of the microprocessor 1000 may be reduced.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
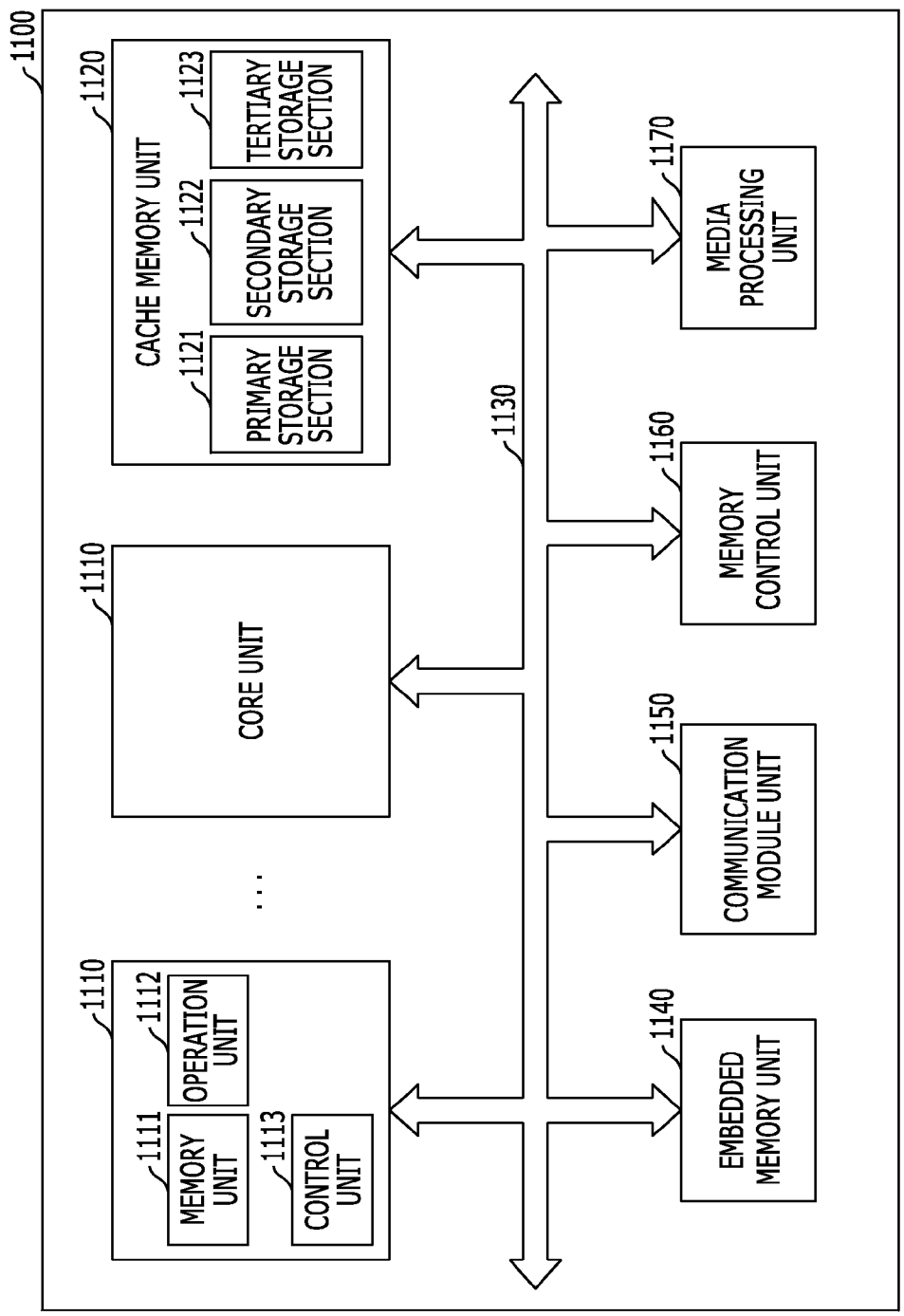
FIG. 5 is an example of configuration diagram of a processor implementing memory circuitry in accordance with an embodiment of the present invention.

FIG. 5 is an example of configuration diagram of a processor implementing memory circuitry in accordance with an embodiment of the present invention.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like.

The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a multistack structure that a structure having two memory cells sharing one selector is repeatedly disposed. The structure includes a first electrode, a variable resistance pattern and a second electrode, which are symmetrically disposed on both sides of the selector. Through this, the integration of the cache memory unit 1120 may be increased, a fabrication process may be reduced, and a size of the processor 1100 may be reduced.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
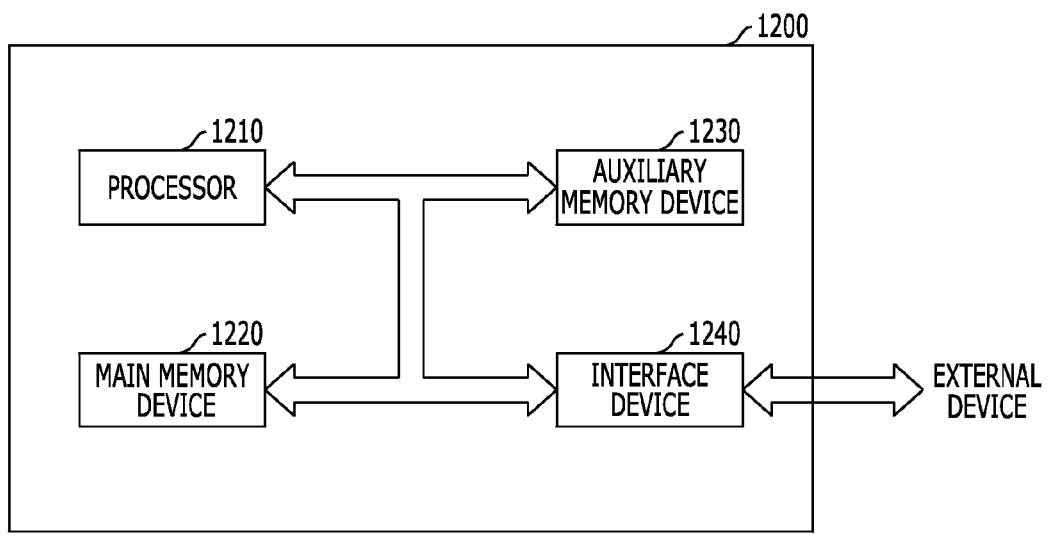
FIG. 6 is an example of configuration diagram of a system implementing memory circuitry in accordance with an embodiment of the present invention.

FIG. 6 is an example of configuration diagram of a system implementing memory circuitry in accordance with an embodiment of the present invention.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a multi-stack structure that a structure having two memory cells sharing one selector is repeatedly disposed. The structure includes a first electrode, a variable resistance pattern and a second electrode, which are symmetrically disposed on both sides of the selector. Through this, the integration of the main memory device 1220 may be increased, a fabrication process may be reduced, and a size of the system 1200 may be reduced.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a multi-stack structure that a structure having two memory cells sharing one selector is repeatedly disposed. The structure includes a first electrode, a variable resistance pattern and a second electrode, which are symmetrically disposed on both sides of the selector. Through this, the integration of the auxiliary memory device 1230 may be increased, a fabrication process may be reduced, and a size of the system 1200 may be reduced.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
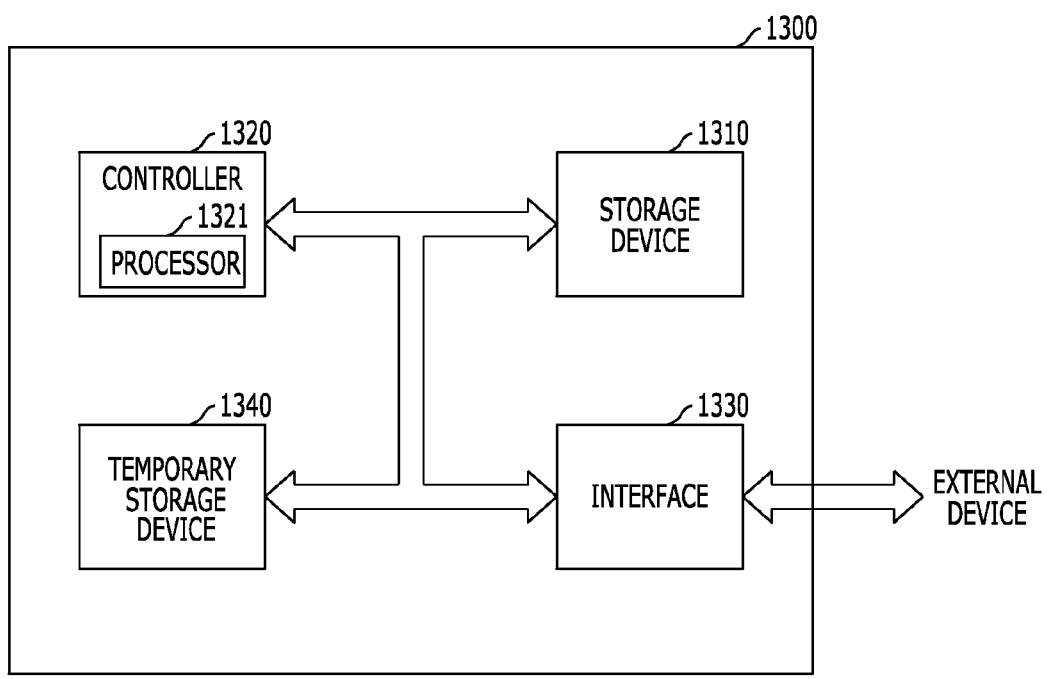
FIG. 7 is an example of configuration diagram of a data storage system implementing memory circuitry in accordance with an embodiment of the present invention.

FIG. 7 is an example of configuration diagram of a data storage system implementing memory circuitry in accordance with an embodiment of the present invention.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a multi-stack structure that a structure having two memory cells sharing one selector is repeatedly disposed. The structure includes a first electrode, a variable resistance pattern and a second electrode, which are symmetrically disposed on both sides of the selector. Through this, the integration of the temporary storage device 1340 may be increased, a fabrication process may be reduced, and a size of the data storage system 1300 may be reduced.

Figure 8:
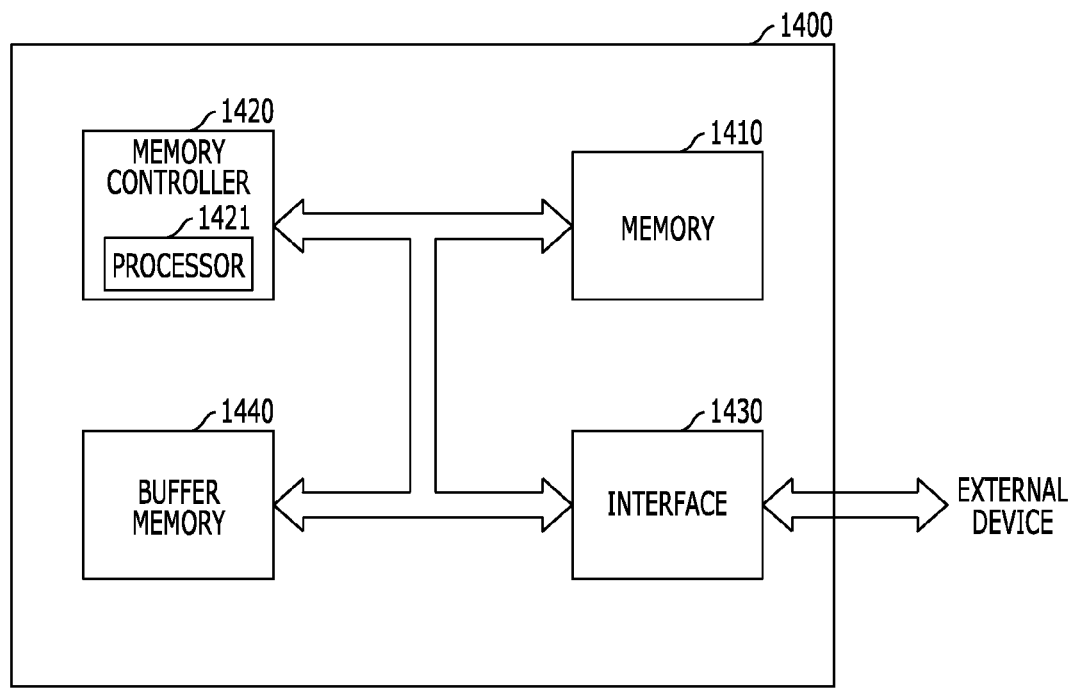
FIG. 8 is an example of configuration diagram of a memory system implementing memory circuitry in accordance with an embodiment of the present invention.

FIG. 8 is an example of configuration diagram of a memory system implementing memory circuitry based on the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a multi-stack structure that a structure having two memory cells sharing one selector is repeatedly disposed. The structure includes a first electrode, a variable resistance pattern and a second electrode, which are symmetrically disposed on both sides of the selector. Through this, the integration of the memory 1410 may be increased, a fabrication process may be reduced, and a size of the memory system 1300 may be reduced.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a multi-stack structure that a structure having two memory cells sharing one selector is repeatedly disposed. The structure includes a first electrode, a variable resistance pattern and a second electrode, which are symmetrically disposed on both sides of the selector. Through this, the integration of the buffer memory 1340 may be increased, a fabrication process may be reduced, and a size of the memory system 1300 may be reduced.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 4 to 8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device with a semiconductor memory unit that includes a plurality of cell structures, each of the cell structures comprising:
    a selector;
    two first electrodes disposed on opposing sides of the selector;
    two variable resistance patterns disposed on opposing sides of the two first electrodes; and
    two second electrodes disposed on opposing sides of the two variable resistance patterns,
    wherein the two first electrodes, the two variable resistance patterns, the two second electrodes, and the selector define two memory cells sharing the selector.

2. The electronic device according to claim 1, wherein the selector, the two first electrodes and the two variable resistance patterns are line type structures which extend in a first direction.

3. The electronic device according to claim 1, wherein the semiconductor memory unit further comprises a plurality of the second electrodes arrayed at a constant interval in a first direction, and wherein the plurality of second electrodes are pillars.

4. The electronic device according to claim 2, wherein the semiconductor memory unit further comprises a plurality of the cell structures arrayed at a constant interval in a second direction crossing the first direction.

5. The electronic device according to claim 4, wherein cell structures of the plurality of the cell structures on a single layer are separated from one another by insulation patterns.

6. The electronic device according to claim 1,
    wherein one of the two first electrodes serves as a lower electrode for a first memory cell and as an intermediary electrode for a second memory cell, and
    wherein the other of the two first electrodes serves as an intermediary electrode for the first memory cell and as a lower electrode for the second memory cell.

7. An electronic device with a semiconductor memory unit that comprises:
    a multi-layer stacked structure comprising a plurality of layers, each layer including a plurality of cell structures, each of the cell structures comprising:
    a selector;
    two first electrodes disposed on opposing sides of the selector;
    two variable resistance patterns disposed on opposing sides of the two first electrodes; and
    two second electrodes disposed on opposing sides of the two variable resistance patterns,
    wherein the two first electrodes, the two variable resistance patterns, the two second electrodes, and the selector define two memory cells sharing the selector.

8. The electronic device according to claim 7, wherein the selector, the first electrodes and the variable resistance patterns are line type patterns extending in a first direction.

9. The electronic device according to claim 7, wherein the second electrodes are pillar type electrodes which vertically penetrate the plurality of layers, and are arrayed at a constant interval in a first direction.

10. The electronic device according to claim 7, further comprising:
    a plurality of interlayer insulation layers disposed between the plurality of layers.

11. The electronic device according to claim 8, wherein cell structures of the plurality of the cell structures in each layer are repeatedly arrayed at a constant interval in a second direction crossing the first direction.

12. The electronic device according to claim 11, further comprising:
isolation insulation patterns disposed in spaces defined by the interval in the second direction.

13. The electronic device according to claim 7, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory unit is part of the memory unit in the microprocessor.

14. The electronic device according to claim 7, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit that is part of the cache memory unit in the processor.

15. The electronic device according to claim 7, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor perform the operation using the program and the information when executing the program; and
an interface device configured to perform communication between at least one of the processor, the auxiliary memory device and the main memory device and the outside,
wherein the semiconductor memory unit is part of the auxiliary memory device or the main memory device in the processing system.

16. The electronic device according to claim 7, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit is part of the storage device or the temporary storage device in the data storage system.

17. The electronic device according to claim 7, further comprising a memory system which includes:
a memory configured to store data and conserve stored data regardless of power supply;
a memory controller configured to control input and output of data to and from the memory according to a command inputted from an outside;
a buffer memory configured to buffer data exchanged between the memory and the outside; and
an interface configured to perform communication between at least one of the memory, the memory controller and the buffer memory and the outside,
wherein the semiconductor memory unit that is part of the memory or the buffer memory in the memory system.

* * * * *